United States Patent
Kawasaki et al.

(10) Patent No.: US 11,946,155 B2
(45) Date of Patent: Apr. 2, 2024

(54) SINGLE-CRYSTAL GROWING CRUCIBLE, SINGLE-CRYSTAL PRODUCTION METHOD AND SINGLE CRYSTAL

(71) Applicant: TDK CORPORATION, Tokyo (JP)

(72) Inventors: Katsumi Kawasaki, Tokyo (JP); Jun Hirabayashi, Tokyo (JP); Minoru Fujita, Tokyo (JP); Daisuke Inokuchi, Tokyo (JP); Jun Arima, Tokyo (JP); Makio Kondo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 157 days.

(21) Appl. No.: 17/299,695

(22) PCT Filed: Dec. 3, 2019

(86) PCT No.: PCT/JP2019/047260
§ 371 (c)(1),
(2) Date: Jun. 3, 2021

(87) PCT Pub. No.: WO2020/116458
PCT Pub. Date: Jun. 11, 2020

(65) Prior Publication Data
US 2022/0056611 A1    Feb. 24, 2022

(30) Foreign Application Priority Data
Dec. 4, 2018   (JP) .................. 2018-227084

(51) Int. Cl.
*C30B 11/00*    (2006.01)
*C30B 29/16*    (2006.01)

(52) U.S. Cl.
CPC ............ *C30B 11/002* (2013.01); *C30B 29/16* (2013.01)

(58) Field of Classification Search
CPC .............................. C30B 11/002; C30B 29/16
See application file for complete search history.

(56) References Cited

U.S. PATENT DOCUMENTS

| | | | |
|---|---|---|---|
| 5,123,996 A * | 6/1992 | Shahid | C30B 11/14 |
| | | | 117/902 |
| 5,312,506 A * | 5/1994 | Omino | C30B 11/002 |
| | | | 117/223 |

(Continued)

FOREIGN PATENT DOCUMENTS

| | | | | |
|---|---|---|---|---|
| JP | 09295887 A | * | 11/1997 | ............. C30B 11/00 |
| JP | H09-295887 A | | 11/1997 | |

(Continued)

OTHER PUBLICATIONS

European Patent Office, English computer translation of KR 10-2009-0064998 (Year: 2023).*

(Continued)

*Primary Examiner* — Matthew J Song
(74) *Attorney, Agent, or Firm* — Oliff PLC

(57) ABSTRACT

A crucible for growing a single-crystal in which a raw material melt for growing the single-crystal is solidified while being accommodated includes a side wall part configured to surround the raw material melt and a bottom part configured to support the raw material melt while being continuous with the side wall part, in which the side wall part has circumferential length redundancy inside the side wall part in a cross-sectional view. The side wall part has a portion where the circumference length is redundant inside any portion in the cross-sectional view, and when the crucible for growing a single-crystal is cooled in a cooling process after the single-crystal growth, the portion where the circumference length is redundant inside in the cross-sectional view is expanded to an outside of the crucible for growing a single-crystal.

4 Claims, 14 Drawing Sheets

(A)

(B)

(56) References Cited

U.S. PATENT DOCUMENTS

| | | | |
|---|---|---|---|
| 8,172,945 B2* | 5/2012 | Shimazu | C30B 15/10 |
| | | | 117/200 |
| 2004/0007708 A1 | 1/2004 | Chinose et al. | |
| 2006/0001031 A1 | 1/2006 | Ichinose et al. | |
| 2008/0070337 A1 | 3/2008 | Ichinose et al. | |
| 2008/0127885 A1* | 6/2008 | Hagi | C30B 29/42 |
| | | | 117/209 |
| 2008/0237607 A1 | 10/2008 | Ichinose et al. | |
| 2010/0038652 A1 | 2/2010 | Ichinose et al. | |
| 2013/0248902 A1 | 9/2013 | Ichinose et al. | |
| 2014/0306237 A1 | 10/2014 | Ichinose et al. | |
| 2017/0306521 A1 | 10/2017 | Hoshikawa et al. | |
| 2017/0362738 A1 | 12/2017 | Galazka et al. | |
| 2019/0376914 A1* | 12/2019 | Schindler | G01N 25/4813 |

FOREIGN PATENT DOCUMENTS

| | | | | |
|---|---|---|---|---|
| JP | 2000-143383 A | 5/2000 | | |
| JP | 3679097 B2 | 8/2005 | | |
| JP | 2016-079080 A | 5/2016 | | |
| JP | 2017-193466 A | 10/2017 | | |
| JP | 2018-501184 A | 1/2018 | | |
| JP | 2018-177552 A | 11/2018 | | |
| KR | 10-2009-0064998 | * | 6/2009 | C30B 15/02 |

OTHER PUBLICATIONS

European Patent Office, English computer translation of JP 09-295887 (Year: 2023).*

Hoshikawa et al., "Growth of β-Ga2O3 single crystals using vertical Bridgman method in ambient air," Journal of Crystal Growth, 2016, vol. 447, pp. 36-41.

Víllora et al., "β-Ga2O3 and single-crystal phosphors for high-brightness white LEDs & LDs, and β-Ga2O3 potential for next generation of power devices," Proceedings of SPIE, Apr. 8, 2014, vol. 8987, pp. 1-12.

Orlandi et al., "Thermal expansion coefficients of β-Ga2O3 single crystals," Applied Physics Express, 2015, vol. 8, pp. 111101-1-111101-3.

Barter et al., "Thermal Expansion of Rhodium-Platinum Alloys," Platinum Metals Review, 1960, Vo. 4, No. 4, pp. 138-140.

* cited by examiner

SINGLE-CRYSTAL GROWING CRUCIBLE, SINGLE-CRYSTAL PRODUCTION METHOD AND SINGLE CRYSTAL

TECHNICAL FIELD

The present invention relates to a crucible for growing a single crystal, a method of manufacturing a single crystal, and a single crystal.

BACKGROUND ART

Gallium oxide ($Ga_2O_3$) is semiconductor that has a larger bandgap (around 4.8 eV) than silicon carbide (SiC: bandgap=around 3.3 eV) or gallium nitride (GaN: bandgap=around 3.4 eV), which is known as wide-gap semiconductor. When applied to electronic devices, gallium oxide can be expected to have excellent device characteristics such as high withstand voltage, high output, and low loss.

As the gallium oxide, five types of crystal polymorphisms from α (alpha) to ε (epsilon) have been confirmed. Of these crystal polymorphisms, a monoclinic β (beta) phase is stable from room temperature to a melting point (around 1800° C.), and it is possible to grow a single crystal of β-phase gallium oxide (hereinafter, β-phase gallium oxide is referred to as β-$Ga_2O_3$) from a gallium oxide melt.

An edge-defined film-fed growth (EFG) method has been known as a method of growing a large-sized, high-quality β-$Ga_2O_3$ single crystal (see Patent Literature 1). When crystal growth is carried out by the EFG method, a crucible for holding a raw material melt and a die for defining a crystal shape are required. A material having a high melting point exceeding around 1800° C., which is a melting point of β-$Ga_2O_3$, and not having large reducing power enough to deprive the β-$Ga_2O_3$ of oxygen at a high temperature of around 1800° C. is preferable for the crucible and die.

The materials that satisfy these conditions are limited, and the materials used for the same purpose are practically only iridium (Ir). Ir is also oxidized at a temperature of around 1800° C. under an oxygen partial pressure exceeding several %. On the other hand, β-$Ga_2O_3$ undergoes a decomposition reaction that loses oxygen at a temperature of around 1800° C. under the oxygen partial pressure of 10% or less. That is, in the EFG method in which Ir is used as a crucible or a die, when the crystal growth is carried out by lowering the oxygen partial pressure to several % or less in order to suppress the oxidation of Ir, high-density oxygen deficiency that frequently occurs in oxide crystals grown under oxygen deficiency exists in the grown β-$Ga_2O_3$. Since the oxygen deficiency acts as an n-type impurity to produce a high concentration of donors, it is difficult to precisely control the donor concentration.

As a means for overcoming these problems, it has been proposed to grow a β-$Ga_2O_3$ single crystal by a vertical Bridgman (VB) method in which a Pt—Rh alloy is used for a crucible (see Patent Literature 2 and Non-Patent Literature 1). The vertical Bridgman (VB) method or a vertical gradient freeze (VGF) method is a method of obtaining a single crystal by filling a raw material in a crucible in advance and solidifying a raw material melt starting from a bottom part of the crucible or a seed crystal disposed at the bottom part of the crucible under a temperature gradient formed so that a temperature of an upper portion of the crucible is high and a temperature of a lower portion of the crucible is low.

In the VB method or the VGF method, a crystal shape is defined by a crucible shape, and shape control during the crystal growth is unnecessary. Therefore, it is possible to grow under a low temperature gradient and obtain high-quality crystals. FIG. 13 illustrates a shape of a crucible 50 for growing a single crystal, which is generally used in the VB method. The crucible 50 for growing a single crystal includes a side wall part 5s and a bottom part 5b. The crystal grown in the crucible 50 for growing a single crystal is cooled from a high temperature state immediately after the growing to room temperature in a state where a bottom surface and a side surface are in contact with the crucible 50 for growing a single crystal, and recovered.

A coefficient of linear thermal expansion of β-$Ga_2O_3$ from 300K to 1300K is $1.9 \times 10^{-6}$/K in an a-axis direction and $5.9 \times 10^{-6}$/K in b-axis and c-axis directions (see Non-Patent Literature 2 and Non-Patent Literature 3). On the other hand, the coefficient of linear thermal expansion of a Pt-30% Rh alloy from 0° C. to 1500° C. is about $11 \times 10^{-6}$/K (see Non-Patent Document 4). FIG. 14 illustrates the linear thermal expansion coefficient of a Pt-Rh alloy and β-$Ga_2O_3$ at high temperature, which is described in Non-Patent Literatures 2 to 4.

CITATION LIST

Patent Literature

Patent Literature 1: Japanese Patent No. 3679097
Patent Literature 2: Japanese Unexamined Patent Publication No. 2017-193466

Non Patent Literature

Non-Patent Literature 1: K. Hoshikawa, 5 et al., "Growth of β-$Ga_2O_3$ single crystals using vertical Bridgman method in ambient air", Journal of Crystal Growth, Elsevier, August 2016, Vol. 447, p.36-41

Non-Patent Literature 2: Encarnacion G. Villora, 4 et al., "β-$Ga_2O_3$ and single-crystal phosphors for high-brightness white LEDs & LDs, and β-$Ga_2O_3$ potential for next generation of power devices", Proceedings of SPIE, SPIE, Apr. 8, 2014, Vol. 8987: "Oxide-based Materials and Devices V"

Non-Patent Literature 3: Fabio Orlandi, 4 et al., "Thermal expansion coefficients of β-$Ga_2O_3$ single crystals", Applied Physics Express, The Japan Society of Applied Physics, November 2015, Volume 8, Number 11, 111101

Non-Patent Document 4: B. Barter, 2 et al., "Thermal Expansion of Rhodium-Platinum Alloys", Platinum Metals Review, Johnson Matthey PLC, October 1960, volume 4, Issue 4, p.138-140

SUMMARY OF INVENTION

Technical Problem

However, when a single crystal of β-$Ga_2O_3$ is grown in a crucible made of Pt-30% Rh, since the coefficient of thermal expansion of the crucible is about 2 to 6 times the coefficient of thermal expansion of the single crystal, a shrinkage rate of the crucible in a cooling process is larger than that of the single crystal. The single crystal present inside the crucible continues to be applied with pressure due to the shrinkage of the crucible during the cooling. Stress caused by the shrinkage of the crucible applied to the single crystal causes cracks in the single crystal and a decrease in the crystallinity of the single crystal.

According to Non-Patent Literature 1 above, a surface of the β-$Ga_2O_3$ single crystal grown by the VB method using the crucible of the Pt—Rh alloy is smooth and is glossy. Non-Patent Literature 1 describes that the grown crystals and the crucible are not attached. Since there is no adhesion phenomenon, the single crystal easily separates from the crucible when no stress is applied between the single crystal and the crucible.

However, when the stress caused by the shrinkage of crucible is applied from the crucible in the cooling process after the crystal growth, the single crystal is strongly tightened and is difficult to be extracted from the crucible due to friction. In order to recover the single crystal from the crucible, since there are cases where the crucible has no choice but to break and the crucible of expensive precious metals may be destroyed each time crystals are grown, the cost of growing a single crystal increases significantly.

The present invention has been made to solve the above-mentioned problems, and an object of the present invention provides a crucible for growing a single crystal capable of reducing application of stress caused by a shrinkage of a cooled crucible to the grown single crystal, a method of manufacturing a single crystal, and a single crystal manufactured by the method of manufacturing a single crystal.

Solution to Problem

According to an aspect of the present invention, there is provided a crucible for growing a single crystal in which a raw material melt for growing the single crystal is solidified while being accommodated, the crucible including: a side wall part configured to surround the raw material melt and a bottom part configured to support the raw material melt while being continuous with the side wall part, in which the side wall part has circumferential length redundancy inside of the side wall part in a cross-sectional view.

According to this configuration, the crucible for growing a single crystal in which the raw material melt for growing the single crystal is solidified while being accommodated includes the side wall part configured to surround the raw material melt and the bottom part configured to support the raw material melt while being continuous with the side wall part, in which the side wall part has the circumferential length redundancy inside of the side wall part in the cross-sectional view, whereby the side wall part has a portion where the circumference length is redundant inside any portion in the cross-sectional view, and when the crucible for growing a single crystal is cooled in a cooling process after the single crystal growth, the portion where the circumference length is redundant inside in the cross-sectional view is expanded to an outside of the crucible for growing a single crystal, so it is possible to reduce the application of the stress caused by the shrinkage of the cooled crucible for growing a single crystal to the grown single crystal.

According to another aspect of the present invention, there is provided a crucible for growing a single crystal in which a raw material melt for growing the single crystal is solidified while being accommodated, the crucible including: a side wall part configured to surround the raw material melt and a bottom part configured to support the raw material melt while being continuous with the side wall part, in which the side wall part has an inflection point in a cross-sectional view.

According to this configuration, the crucible for growing a single crystal in which the raw material melt for growing the single crystal is solidified while being accommodated includes the side wall part configured to surround the raw material melt and the bottom part configured to support the raw material melt while being continuous with the side wall part, in which the side wall part has the inflection point in the cross-sectional view on a horizontal plane, whereby the side wall part has a portion which is bent from an inside to an outside in any portion in the cross-sectional view, and when the crucible for growing a single crystal is cooled in a cooling process after the single crystal growth, the portion which is bent from the inside to the outside of the crucible for growing a single crystal in the cross-sectional view is expanded to the outside of the crucible for growing a single crystal, so it is possible to reduce the application of the stress caused by the shrinkage of the cooled crucible for growing a single crystal to the grown single crystal.

In these cases, the side wall part may have a recess in the cross-sectional view.

According to this configuration, since the side wall part has the recess in the cross-sectional view, when the crucible for growing a single crystal is cooled in the cooling process after the single crystal growth, the recess is expanded to the outside of the crucible for growing a single crystal, so it is possible to reduce the application of the stress caused by the shrinkage of the cooled crucible for growing a single crystal to the grown single crystal.

Further, the side wall part may be formed of a smooth closed curve in the cross-sectional view.

According to this configuration, the side wall part is formed of the smooth closed curve in the cross-sectional view, so when the side wall part of the crucible for growing a single crystal moves in a circumferential direction with respect to a side surface of the single crystal existing inside the crucible for growing a single crystal, the side wall part of the crucible for growing a single crystal may move smoothly without being hindered by the shape. Therefore, the possibility that the stress partially generated between the side wall part of the crucible for growing a single crystal and the side surface of the single crystal can be transmitted to the whole to relieve the stress is improved.

Further, the side wall part may have a tapered shape that extends upward from the bottom part.

According to this configuration, since the side wall part has the tapered shape that extends upward from the bottom part, it becomes easier to extract the grown single crystal from the crucible for growing a single crystal.

Further, the side wall part and the bottom part are made of either Pt or a Pt—Rh alloy, and the raw material melt can be used for growing a $\beta$-$Ga_2O_3$-based single crystal.

According to this configuration, the side wall part and bottom part are made of either Pt or Pt—Rh alloy, and the raw material melt is for growing the $\beta$-$Ga_2O_3$-based single crystal, and even when a difference in a coefficient of thermal expansion between the crucible for growing a single crystal and the single crystal is large, it is possible to reduce the application of the stress caused by the shrinkage of the cooled crucible for growing a single crystal to the grown single crystal.

Further, the thickness of the side wall part may be 1 mm or less.

According to this configuration, since the thickness of the side wall part is 1 mm or less, when the crucible for growing a single crystal is cooled in the cooling process after the single crystal growth, a part of the side wall part is easily expanded to the outside of the crucible, so it is possible to further reduce the application of the stress caused by the shrinkage of the cooled crucible for growing a single crystal to the grown single crystal.

Further, according to another aspect of the present invention, there is provided a method of manufacturing a single crystal in which the single crystal is grown using the crucible for growing a single crystal according to one aspect and another aspect of the present invention.

Further, according to another aspect of the present invention, there is provided a single crystal manufactured by the method of manufacturing a single crystal according to another aspect of the present invention.

Advantageous Effects of Invention

According to the crucible for growing a single crystal, the method of manufacturing a single crystal, and the single crystal according to one aspect and another aspect of the present invention, it is possible to reduce the application of the stress caused by the shrinkage of the cooled crucible to the grown single crystal.

DESCRIPTION OF EMBODIMENTS

Hereinafter, embodiments of the present invention will be described in detail with reference to the accompanying drawings. The present inventors have found a method of preventing stress caused by a shrinkage of a crucible for growing a single crystal due to cooling after crystal growth from being applied to the crystals existing inside the crucible for growing a single crystal by conducting their studies on a shape of the crucible for growing a single crystal used in a VB method and a VGF method. Based on this finding, the embodiment of the present invention has been completed.

Configuration Example of Growing Apparatus

Figure 1:
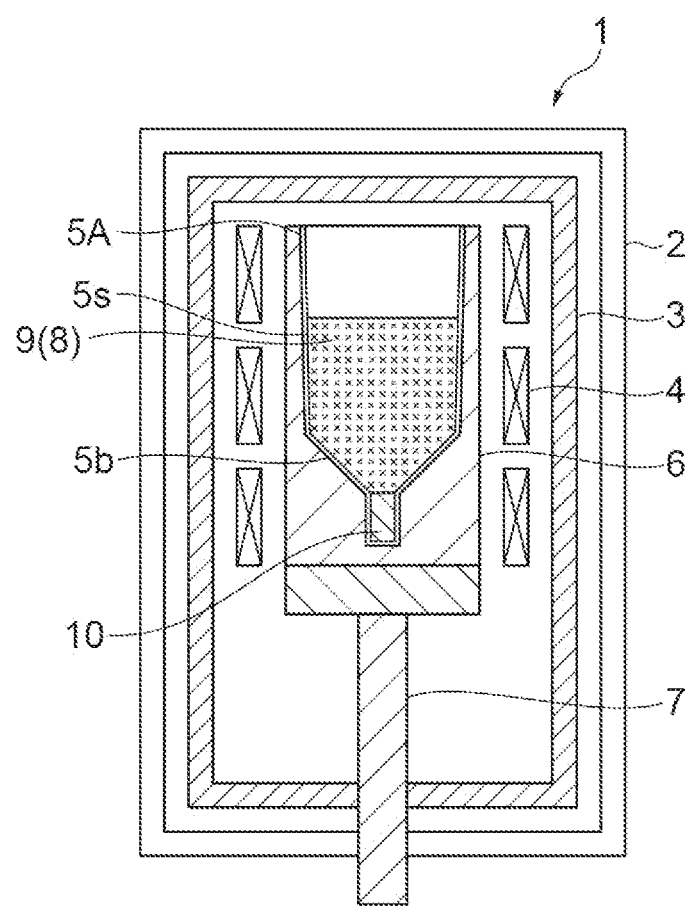
FIG. 1 is a diagram illustrating a configuration example of an apparatus for growing a single crystal according to a first embodiment.

In an apparatus for growing $\beta$-$Ga_2O_3$ crystal according to a first embodiment of the present invention, a Pt—Rh alloy material is used as a material for a crucible for growing a single crystal used for crystal growth. The crucible for growing a single crystal according to the first embodiment of the present invention will be described later. FIG. 1 illustrates a configuration example of an apparatus 1 for growing a single crystal that grows $\beta$-$Ga_2O_3$ according to the first embodiment. FIG. 1 illustrates a cross-sectional configuration diagram of the apparatus 1 for growing a single crystal in a plane passing through a central axis of a crucible 5A for growing a single crystal. This apparatus 1 for growing a single crystal is an apparatus for growing $\beta$-$Ga_2O_3$ crystal by the VB method (vertical Bridgman method) in an oxidizing atmosphere (atmosphere).

In the apparatus 1 for growing a single crystal, a heat insulating material 3 is provided along an inner wall of the chamber 2. A heater 4, the crucible 5A for growing a single crystal, and a crucible holder 6 for holding the crucible 5A for growing a single crystal are provided in an internal space surrounded by the heat insulating material 3. The crucible holder 6 is supported from a bottom part by a crucible receiving shaft 7.

A seed crystal 10 and a raw material 9 on an upper portion of the seed crystal 10 are stacked and housed inside the crucible 5A for growing a single crystal. A raw material melt 8 for growing a single crystal is accommodated and solidified in the crucible 5A for growing a single crystal. The crucible 5A for growing a single crystal has a side wall part 5s that surrounds the raw material melt 8 and a bottom part 5b that supports the raw material melt 8 while being continuous with the side wall part 5s. A temperature measuring means such as a thermocouple (not illustrated) is provided around the crucible 5A for growing a single crystal, and the temperature near the seed crystal 10, the temperature of the upper portion and the lower portion of the crucible 5A for growing a single crystal, and the like are measured during the crystal growth.

The crucible receiving shaft 7 can be driven up and down by a driving mechanism (not illustrated), and it is possible to continuously control a relative position of the crucible 5A for growing a single crystal with respect to the heater 4 during the single crystal growth. The crucible receiving shaft 7 may rotate the crucible 5A for growing a single crystal inside the heater 4 by rotating around a shaft line. The heat insulating material 3, the crucible holder 6, and the crucible receiving shaft 7 are preferably made of alumina or zirconia having heat resistance up to about 2000° C.

The heater 4 heats the crucible 5A for growing a single crystal. The temperature inside the crucible 5A for growing a single crystal needs to reach a temperature above a melting point of β-Ga$_2$O$_3$ (about 1800° C.), and a resistance heating method or a high frequency heating method is often applied. It is preferable that the heater 4 can control a temperature distribution in a vertical direction by a plurality of temperature control systems, and depending on the arrangement and shape of the heater 4 and the heat insulating material 3, during the single crystal growth, the temperature distribution can be formed within the crucible 5A for growing a single crystal such that a temperature of the upper portion is high and a temperature of the lower portion is low.

Description of Process of Growing Single Crystal

The process of growing β-Ga$_2$O$_3$ single crystal, that is, a method of manufacturing a single crystal, will be described with reference to FIGS. 2(A) to 2(G). First, the seed crystal 10 of β-Ga$_2$O$_3$ is disposed in the crucible 5A for growing a single crystal, and the raw material 9 is filled in the upper portion of the crucible 5A it (FIG. 2(B)). The crucible 5A for growing a single crystal temporarily descends sufficiently with respect to the heater 4 before heating, and is raised before and after temperature in a furnace reaches near a melting point.

Figure 2:
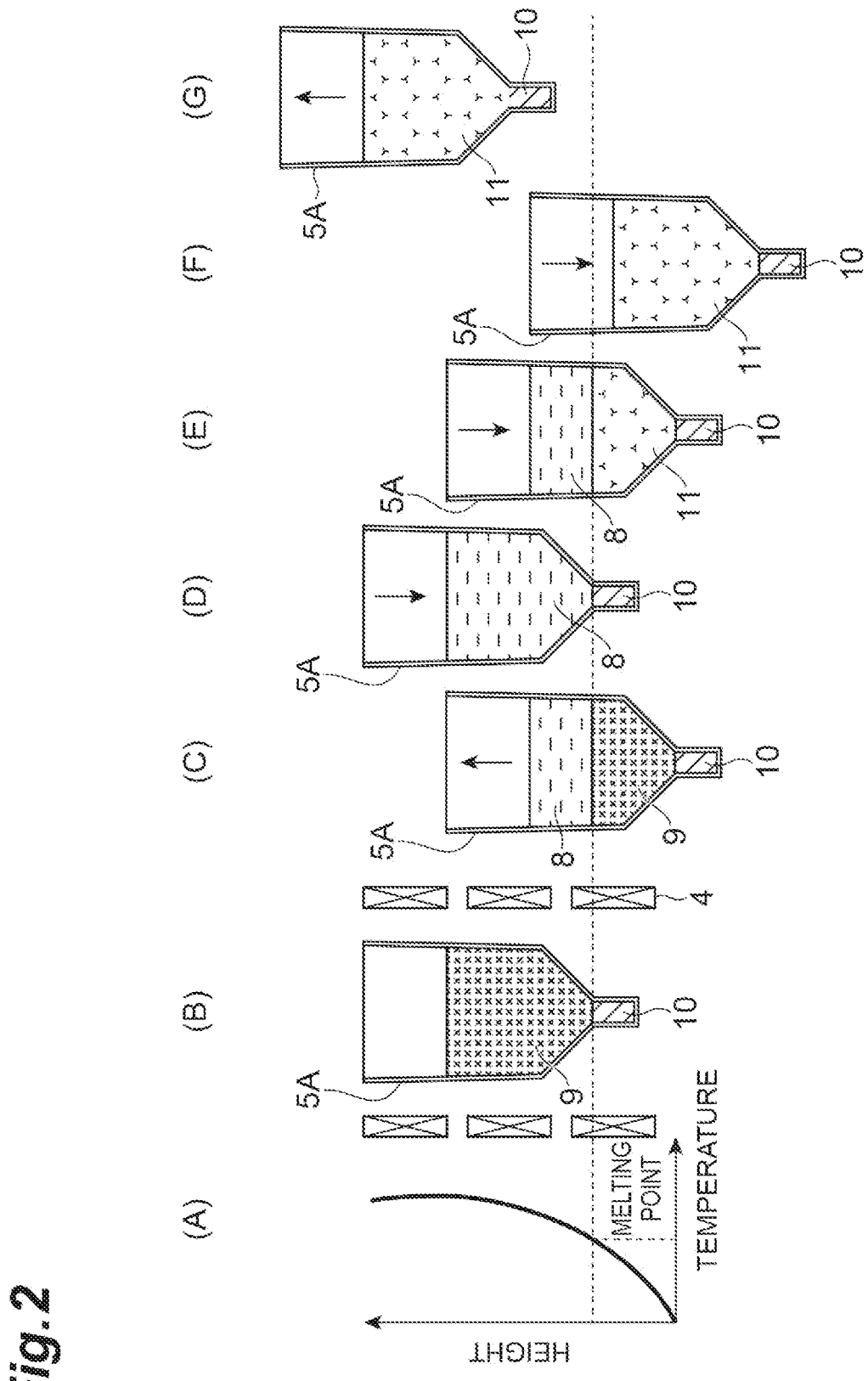
FIG. 2(A) is a graph illustrating a relationship between height and temperature in a process of growing a single crystal.
FIGS. 2(B) to 2(G) are diagrams illustrating the process of growing a single crystal.

The temperature distribution in the crucible 5A for growing a single crystal, which is heated by the heater 4 installed near the crucible 5A for growing a single crystal and reached about 1800° C. near the melting point of β-Ga$_2$O$_3$, is controlled so that the upper side is the melting point or higher and the lower side is the melting point or lower across the melting point of β-Ga$_2$O$_3$ (FIG. 2(A)).

When the crucible 5A for growing a single crystal is raised, the raw material 9 housed therein enters a high temperature region higher than the melting point, so that the upper part of the raw material 9 starts from being dissolved and becomes the raw material melt 8 (FIG. 2(C)). When the upper portion of the seed crystal 10 housed in the crucible 5A for growing a single crystal reaches the melting point region and the upper end of the seed crystal 10 is melted, the rising of the crucible 5A for growing a single crystal is stopped. At this time, since all the raw materials 9 located above the seed crystal 10 are in the region higher than the melting point, all the raw materials 9 are in the state of the raw material melt 8 (FIG. 2(D)).

Next, when the crucible 5A for growing a single crystal starts to descend at a predetermined descending speed, the raw material melt 8 is gradually solidified from the lower portion. At this time, the raw material melt 8 is precipitated in a state in which the raw material melt 8 is always in constant contact with the single crystallized portion along the seed crystal 10 or a crystal orientation of the seed crystal 10, so that the solidified portion is grown along the crystal orientation of the seed crystal 10 as a single crystal 11 (FIG. 2(E)).

The crucible 5A for growing a single crystal descends until the entire raw material melt 8 is solidified, and after the single crystal growth is completed (FIG. 2(F)), the output of the heater 4 is lowered and the temperature is lowered to a state in which the maximum temperature in the furnace is below the melting point of β-Ga$_2$O$_3$. Eventually, the temperature inside the furnace is lowered to room temperature, and the grown single crystal is recovered. However, when cooling to room temperature, it is preferable to move the position of the crucible 5A for growing a single crystal to the upper region where the temperature gradient is small, perform annealing processing for the required time, and reduce a residual stress in the crystal due to the temperature distribution during the growth (FIG. 2(G)).

As to Shape of Crucible for Growing Single Crystal

Figure 3:
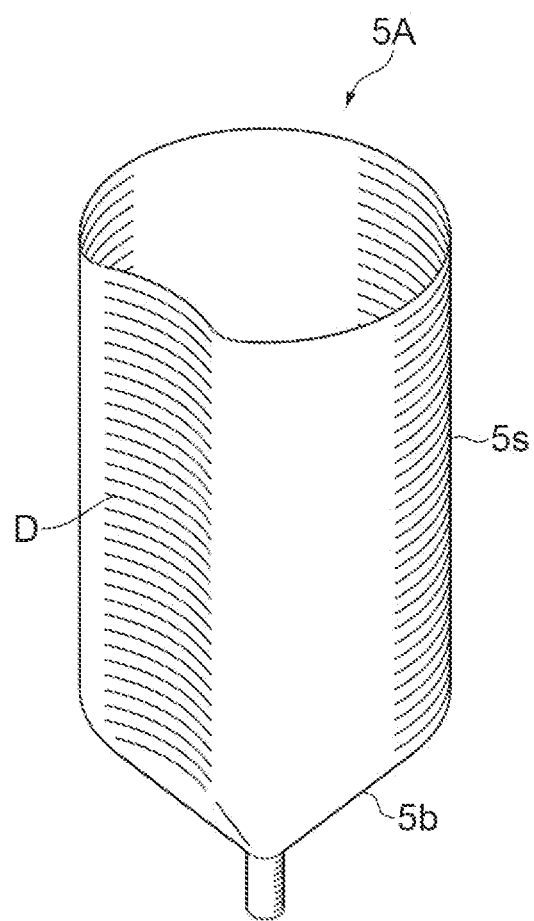
FIG. 3 is a schematic perspective view illustrating a shape of the crucible for growing a single crystal according to the first embodiment.
Figure 4:
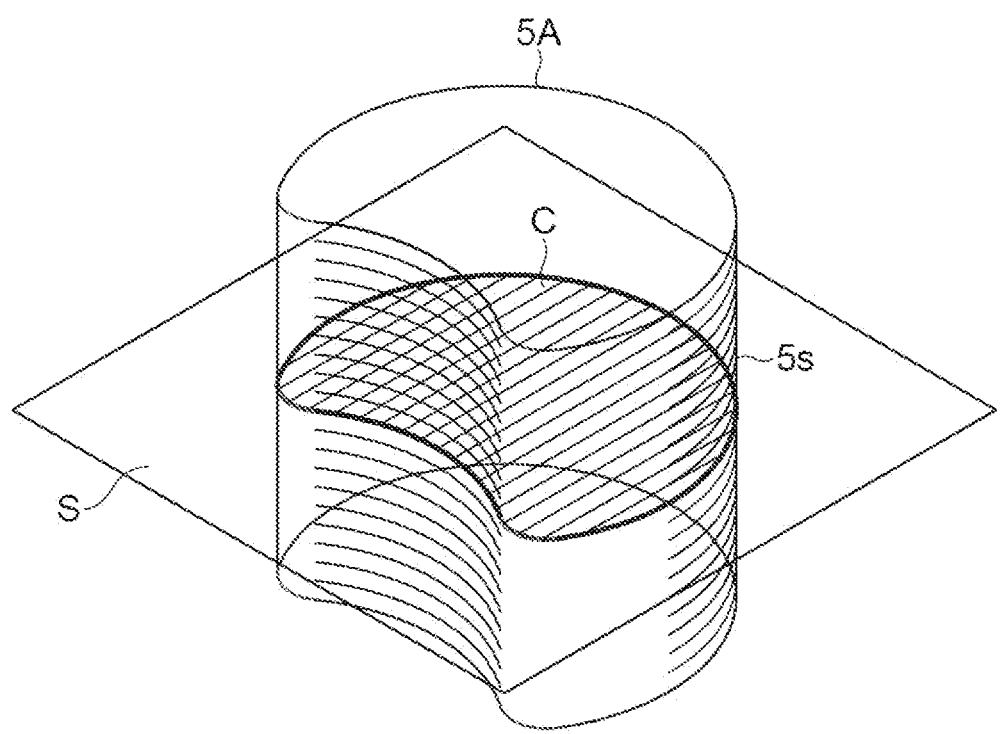
FIG. 4 is a schematic perspective view illustrating a circumferential length redundancy of a side wall part of a crucible for growing a single crystal.
Figure 5:
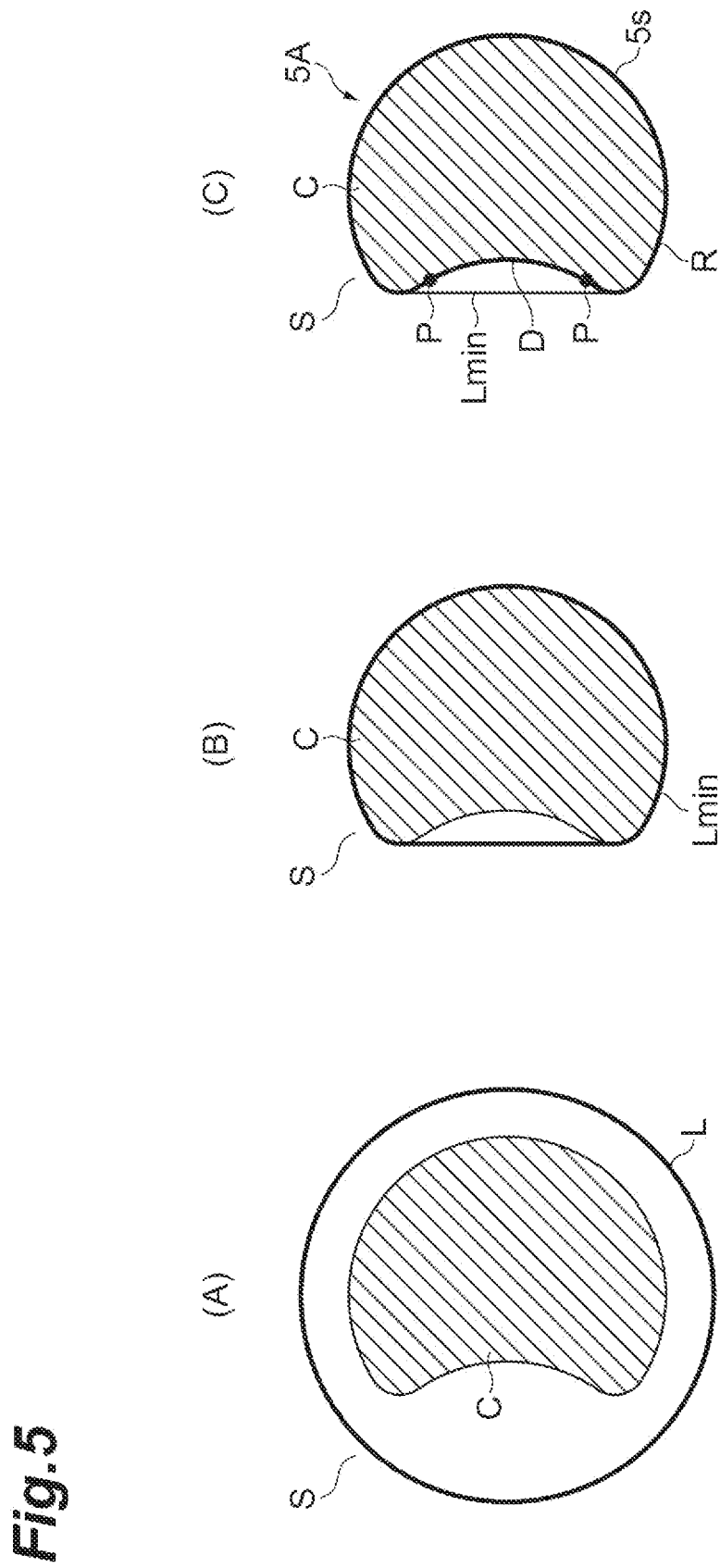
FIGS. 5(A) to 5(C) are plan views for describing the circumferential length redundancy of the side wall part of the crucible for growing a single crystal.

As to Circumferential Length Redundancy of Side Wall Part of Crucible for Growing Single Crystal Circumferential length redundancy of a side surface portion s of a crucible 5 for growing a single crystal will be described with reference to FIGS. 3, 4, 5(A), 5(B), and 5(C). FIG. 3 is a schematic perspective view illustrating the shape of the crucible 5A for growing a single crystal according to the first embodiment, FIG. 4 is a perspective view illustrating a horizontal cross-section shape of the crucible 5 for growing a single crystal, and FIGS. 5(A) to 5(C) are plan views. As illustrated in FIG. 3, the crucible 5A for growing a single crystal has the side wall part 5s that surrounds the raw material melt 8 and a bottom part 5b that supports the raw material melt 8 while being continuous with the side wall part 5s. As will be described later, the side wall part 5s has a recess D in a cross-sectional view.

As illustrated in FIG. 4, a cross-section region C of the crucible on a horizontal plane S is defined on the horizontal plane S that crosses the single crystal 11. As illustrated in FIG. 5(A), in a closed curve L on the horizontal plane S including the cross-section region C of the crucible, as illustrated in FIG. 5(B), a closed curve in which a circumferential length of a closed curve L is shortest is referred to as a closed curve Lmin, and the circumferential length is referred to as lmin. As illustrated in FIG. 5(C), a circumferential length of a closed curve R indicating a boundary of the cross-section region C of the crucible is referred to as r. The fact that r is longer than lmin and the closed curve R is located inside the closed curve Lmin is defined that the side wall part 5s has the circumferential length redundancy inside in the cross-sectional view.

In the present embodiment, in the temperature range where the raw material 9 is the melting point or higher, the side wall part 5s has the circumferential length redundancy inside in the cross-sectional view. The coefficient of thermal expansion of the crucible 5A for growing a single crystal is larger than that of the single crystal 11 grown inside thereof, and in the cooling process after the single crystal growth, even when the shrinkage of the crucible 5A for growing a single crystal is above the shrinkage of the single crystal 11, in the state in which the circumferential length is redundant inside thereof, there is room for the side wall part 5s to be shrunk by being expanding outward of the circumference length, so no compressive stress is applied to the single crystal 11. In addition, in the present embodiment, even in the temperature range where the temperature of the raw material 9 is lower than the melting point, the side wall part 5s is expanded to the circumference length during the cooling, but the side wall part 5s is not completely expanded, and the circumferential length redundancy remains.

Therefore, in the cooling step after the single crystal growth, it is possible to suppress the decrease in crystallinity of the single crystal 11 due to the stress. In addition, when the single crystal 11 is extracted from the crucible 5A for growing a single crystal at room temperature, the frictional resistance is small because the stress caused by the shrinkage does not act between the crucible 5A for growing a single crystal and the single crystal 11, so it is possible to more easily recover the single crystal 11 without destroying the crucible 5A for growing a single crystal.

As to Inflection Point of Side Wall Part of Crucible for Growing Single Crystal

The inflection point of the side wall part 5s of the crucible 5 for growing a single crystal will be described with reference to FIG. 5(C). As illustrated in FIG. 5(C), in the present embodiment, the side wall part 5s defined by the closed curve R has an inflection point P in the cross-sectional view. The inflection point P is a point where positive and negative signs of a curvature change on the closed curve R on the horizontal plane S and the curvature becomes 0. In the state where the side wall part 5s has the inflection point P in the cross-sectional view, the portion which is bent from the inside to the outside of the crucible 5A for growing a single crystal in the cross-sectional view is expanded to the outside of the crucible 5A for growing a single crystal, so no compressive stress is applied to the single crystal 11. Therefore, the decrease in the crystallinity of the single crystal 11 due to the stress can be suppressed, and the single crystal 11 can be more easily recovered without destroying the crucible 5A for growing a single crystal.

As to Recess

As illustrated in FIG. 5(C), when at least a part of a line segment connecting two points in the closed curve R defining the side wall part 5s is located outside the closed curve R, the side wall part 5s is defined as having a recess D in the cross-sectional view. In the present embodiment, as a means to give the circumferential length redundancy and the inflection point P to the inside of the side wall part 5s of the crucible 5A for growing a single crystal inside thereof, the recess D is given to the closed curve R defined on an intersection of the side wall part 5s of the crucible 5A for growing a single crystal and the horizontal plane S.

By providing the recess D on the side wall part 5s of the crucible 5A for growing a single crystal, the recess D is expanded to the outside of the crucible 5A for growing a single crystal, so no compressive stress is applied to the single crystal 11. Therefore, the decrease in the crystallinity of the single crystal 11 due to the stress can be suppressed, and the single crystal 11 can be more easily recovered without destroying the crucible 5A for growing a single crystal. In addition, by the recess D expanded to the outside, a space is generated between the inner surface of the side wall part 5s after the cooling and the side surface of the single crystal 11. By inserting a thin and flat jig into this space and moving the jig in parallel to the side surface of the single crystal 11, it becomes easier to separate the single crystal 11 and the crucible 5A for growing a single crystal.

As to Smoothness

Figure 6:
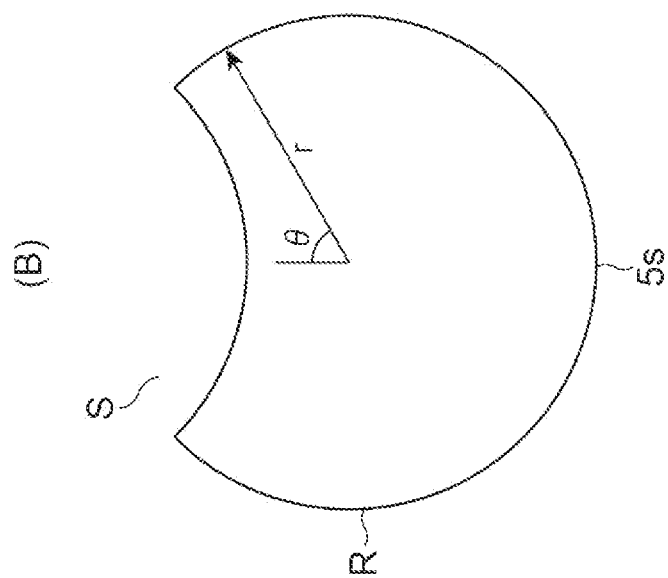
FIGS. 6(A) and 6(B) are diagrams for describing smoothness of the side wall part of the crucible for growing a single crystal.
Figure 6:
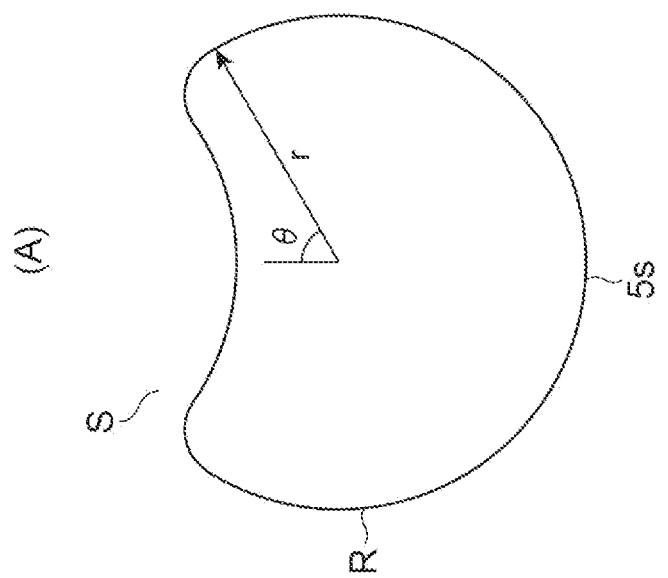

In the present embodiment, the side wall part 5s of the crucible 5A for growing a single crystal is formed of the smooth closed curve R in the cross-sectional view. Referring to FIGS. 6(A) and 6(B), the horizontal cross-sectional shape of the side wall part 5s of the crucible 5A for growing a single crystal will be described using the case where a function r (θ) of the closed curve R is represented. Here, an angle θ indicates an angle with respect to an arbitrary direction on the horizontal plane S. A radius in a direction forming the angle θ from the center of the crucible for growing a single crystal is referred to as r. When this function has a derivative dr/dθ and this derivative is continuous, then the side wall part 5s is defined as being formed of the smooth closed curve in the cross-sectional view.

Figure 7:
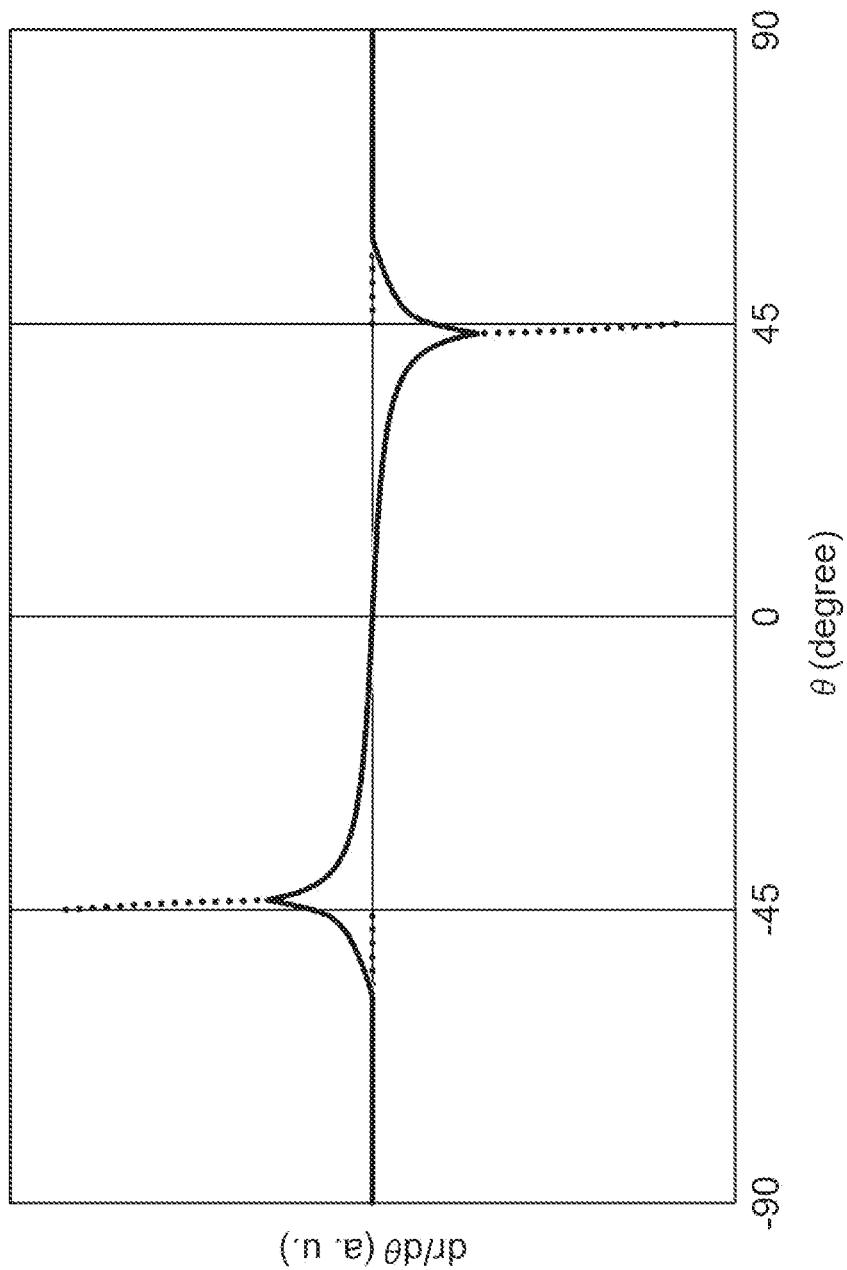
FIG. 7 is a diagram for describing the smoothness depending on presence or absence of continuity of derivatives.

FIG. 6(A) illustrates an example in which the side wall part 5s is formed of the smooth closed curve in the cross-sectional view. FIG. 6(B) illustrates an example in which the side wall part 5s is not formed of the smooth closed curve in the cross-sectional view. Further, FIG. 7 illustrates an example in which the respective derivatives obtained from the shapes of both FIGS. 6(A) and 6(B) are displayed with respect to the angle. The curve shown by the solid line in FIG. 7 shows the derivative of the smooth-shaped closed curve in FIG. 6(A). On the other hand, the curve shown by the dotted line in FIG. 7 shows the derivative of the non-smooth-shaped closed curve in FIG. 6(B).

As is clear from FIG. 7, the solid line is displayed as a continuous line. On the other hand, the dotted line is separated and discontinuous at the position where θ is ±45°. Therefore, it is possible to define whether or not the horizontal cross-sectional shape of the side wall part 5s of the crucible 5A for growing a single crystal is smooth by the continuity of the derivative.

If the side wall part 5s of the crucible 5A for growing a single crystal is formed of the smooth closed curve in the cross-sectional view, when the side wall part 5s of the crucible 5A for growing a single crystal moves in the circumferential direction with respect to the side surface of the single crystal 11 existing inside the crucible 5A for growing a single crystal, the side wall part 5s of the crucible 5A for growing a single crystal can move smoothly without being hindered by the shape. Therefore, the possibility that the stress partially generated between the side wall part 5s of the crucible 5A for growing a single crystal and the side surface of the single crystal 11 can be transmitted to the whole to relieve the stress is improved.

As to Tapered Shape

As illustrated in FIGS. 1 and 3, the side wall part 5s of the crucible 5A for growing a single crystal of the present embodiment has a tapered shape extending upward from the bottom part 5b. The side wall part 5s extends outward at an angle of 1 to 3° in the range from bottom part 5b to the upper end of side wall part 5s. This makes it easier to extract the grown single crystal 11 from the crucible 5A for growing a single crystal.

As to Material of Crucible for Growing Single Crystal and Grown Single Crystal

In the present embodiment, the crucible 5A for growing a single crystal is made of either platinum or a platinum-rhodium alloy, and preferably has a rhodium weight ratio of 20% or more and more preferably 30%. On the other hand, the raw material melt 8 is for growing a $\beta$-$Ga_2O_3$-based single crystal 11. In the present embodiment, even when the difference in the coefficient of thermal expansion between the crucible 5A for growing a single crystal and the single crystal 11 is large, it is possible to reduce the stress caused by the shrinkage of the cooled crucible 5A for growing a single crystal to the single crystal 11.

As to Thickness of Side Wall Part of Crucible for Growing Single Crystal

In the present embodiment, the thickness of the side wall part 5s of the crucible 5A for growing a single crystal is 1 mm or less. The thickness of the side wall part 5*s* is preferably 0.5 mm or less, and more preferably 0.2 mm or less. In the present embodiment, since the thickness of the side wall part 5*s* is as thin as 1 mm or less, when the crucible 5A for growing a single crystal is cooled in the cooling process after the single crystal growth, the recess D of the side wall part 5*s* and the like is easily expanded to the outside of the crucible 5A for growing a single crystal, so it is possible to further reduce the application of the stress caused by the shrinkage of the cooled crucible 5A for growing a single crystal to the grown single crystal 11.

In the present embodiment, the crucible 5A for growing a single crystal in which the raw material melt 8 for growing the single crystal is solidified while being accommodated includes the side wall part 5*s* configured to surround the raw material melt 8 and the bottom part 5*b* configured to support the raw material melt 8 while being continuous with the side wall part 5*s*, in which the side wall part 5*s* has the circumferential length redundancy inside of the side wall part in the cross-sectional view, whereby the side wall part has a portion where the circumference length is redundant inside any portion in the cross-sectional view, and when the crucible 5A for growing a single crystal is cooled in a cooling process after the single crystal growth, the portion where the circumference length is redundant inside in the cross-sectional view is expanded to an outside of the crucible 5A for growing a single crystal, so it is possible to reduce the application of the stress caused by the shrinkage of the cooled crucible 5A for growing a single crystal to the grown single crystal 11.

In the present embodiment, the crucible 5A for growing a single crystal in which the raw material melt 8 for growing the single crystal is solidified while being accommodated includes the side wall part 5*s* configured to surround the raw material melt 8 and the bottom part 5*b* configured to support the raw material melt 8 while being continuous with the side wall part 5*s*, in which the side wall part 5*s* has the inflection point P in the cross-sectional view on a horizontal plane, whereby the side wall part 5*s* has a portion which is bent from an inside to an outside in any portion in the cross-sectional view, and when the crucible 5A for growing a single crystal is cooled in a cooling process after the single crystal growth, the portion which is bent from the inside to the outside of the crucible 5A for growing a single crystal in the cross-sectional view is expanded to the outside of the crucible for growing a single crystal, so it is possible to reduce the application of the stress caused by the shrinkage of the cooled crucible 5A for growing a single crystal to the grown single crystal 11.

In addition, according to the present embodiment, since the side wall part 5*s* has the recess D in the cross-sectional view, when the crucible 5A for growing a single crystal is cooled in the cooling process after the single crystal growth, the recess D is expanded to the outside of the crucible 5A for growing a single crystal, so it is possible to reduce the application of the stress caused by the shrinkage of the cooled crucible 5A for growing a single crystal to the grown single crystal 11.

In addition, according to the present embodiment, the side wall part 5*s* is formed of the smooth closed curve R in the cross-sectional view, so when the side wall part 5*s* of the crucible 5A for growing a single crystal moves in the circumferential direction with respect to the side surface of the single crystal 11 existing inside the crucible 5A for growing a single crystal, the side wall part 5*s* of the crucible for growing a single crystal may move smoothly without being hindered by the shape. Therefore, the possibility that the stress partially generated between the side wall part 5*s* of the crucible 5A for growing a single crystal and the side surface of the single crystal 11 can be transmitted to the whole to relieve the stress is improved.

In addition, according to the present embodiment, since the side wall part 5*s* has the tapered shape that extends upward from the bottom part 5*b*, it becomes easier to extract the grown single crystal 11 from the crucible 5A for growing a single crystal.

In addition, according to the present embodiment, the side wall part 5*s* and the bottom part 5*b* are made of either the Pt or Pt—Rh alloy, and the raw material melt is for growing the $\beta$-$Ga_2O_3$-based single crystal, and even when the difference in the coefficient of thermal expansion between the crucible 5A for growing a single crystal and the single crystal 11 is large, it is possible to reduce the application of the stress caused by the shrinkage of the cooled crucible 5A for growing a single crystal to the grown single crystal 11.

In addition, according to the present embodiment, since the thickness of the side wall part 5*s* is as thin as 1 mm or less, when the crucible 5A for growing a single crystal is cooled in the cooling process after the single crystal growth, a part of the side wall part 5*s* and the like is easily expanded to the outside of the crucible 5A for growing a single crystal, so it is possible to further reduce the application of the stress caused by the shrinkage of the cooled crucible 5A for growing a single crystal to the grown single crystal 11.

Modified Example

Figure 8:
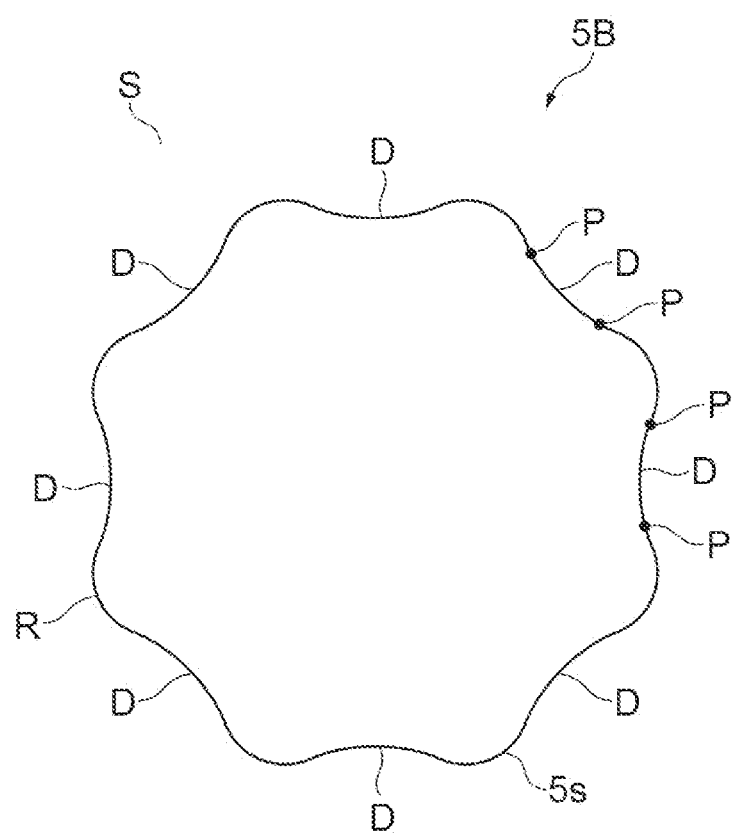
FIG. 8 is a plan view illustrating a side wall part of a crucible for growing a single crystal according to a second embodiment.

Hereinafter, a second embodiment of the present invention will be described. As illustrated in FIG. 8, in crucible 5B for growing a single crystal of the present embodiment, a side wall part 5*s* has a plurality of recesses D in a cross-sectional view and a plurality of pairs of inflection points P. In the example of FIG. 8, the side wall part 5*s* has eight recesses Ds in the cross-sectional view and eight pairs of inflection points P. The plurality of recesses Ds have the same shape. The plurality of recesses Ds and the plurality of pairs of inflection points Ps are disposed on the side wall part 5*s* at equal intervals. In this embodiment, in the cross-sectional view, the plurality of recesses Ds and the plurality of pairs of inflection points Ps are arranged on the side wall part 5*s* at equal intervals, so it is possible to more uniformly reduce application of stress caused by shrinkage of the cooled crucible 5B for growing a single crystal to a grown single crystal 11 on the whole circumference of the side wall part 5*s*.

Although the embodiments of the present invention have been described above, the present invention is not limited to the above embodiments and is implemented in various forms. For example, in addition to the above embodiments, a mode in which the side wall part 5*s* has circumferential length redundancy inside thereof in the cross-sectional view, a mode in which the side wall part 5*s* has the inflection point P in the cross-sectional view, a position of the recess D and a quantity of the recess D can be changed as appropriate.

Experimental Example

Figure 9:
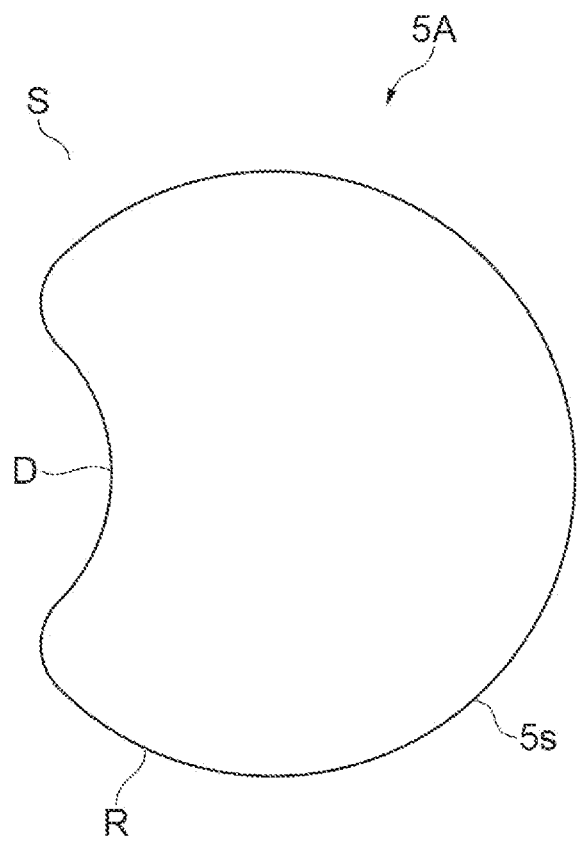
FIG. 9 is a plan view illustrating the side wall part of the crucible for growing a single crystal used in an experimental example.

Hereinafter, embodiments of the present invention will be described with reference to examples, but the embodiments of the present invention are not limited to the following examples. Using an apparatus 1 for growing a single crystal illustrated in FIG. 1, a $\beta$-$Ga_2O_3$ single crystal was grown by a vertical Bridgman (VB) method. In this experimental example, as illustrated in FIG. 9, a crucible 5A for growing a single crystal, which is made of a Pt—Rh alloy having a Rh content of 20 wt % and produced by being processed from a thin plate having a thickness of 0.5 mm, was used. A diameter of the crucible 5A for growing a single crystal was about 100 mm, and a length of the side wall part 5s in a vertical direction was 150 mm. The side wall part 5s had a tapered shape that extends upward from the bottom part 5b at an angle of about 2°.

As illustrated in FIG. 9, one recess D was disposed in the side wall part 5s within a range of 90° from a center of the crucible 5A for growing a single crystal. A central part of the recess D was formed of a curve having a radius of curvature of 30 mm centered at a position of 56.57 mm from the center of the crucible 5A for growing a single crystal. Each end of the recess D was formed of a curve having a radius of curvature of 10 mm.

The crucible 5A for growing a single crystal was annealed in the atmosphere at about 1200° C. before growth, and easily deformed when a force is applied to a side surface thereof. A seed crystal 10, which is a growth nucleus of the single crystal 11, was disposed in a bottom part 5b of the crucible 5A for growing a single crystal. The seed crystal 10 had a cylindrical shape having a diameter of 5 mm and a length of about 20 mm, and was disposed so that a cylinder is upright in the crucible 5A for growing a single crystal. A crystal orientation was selected so that an upper surface of the cylinder is a (100) plane of monoclinic β-Ga$_2$O$_3$, that is, an a plane.

Powdered gallium oxide was filled in a mold and compression-molded using a press at a pressure of about 10 kgf/mm$^2$ Further, the compression-molded gallium oxide powder was fired at 1450° C. for 6 hours. A density of the obtained sintered body was about 4.2. The sintered body having a diameter of about 100 mm and a thickness of 30 mm was divided into four fan-shaped bodies having a central angle of 90°, and was stacked inside a crucible 5A for growing a single crystal as a raw material 9.

The single crystal 11 was grown according to the above procedure (description of a process of growing a single crystal). In this experimental example, as illustrated in FIG. 10(A), when the raw material 9 of β-Ga$_2$O$_3$ inside the crucible 5A for growing a single crystal is melted and is in a state of a raw material melt 8, a crucible outer circumference holding jig 12 was brought into contact with the recess D of the crucible 5A for growing a single crystal so that a horizontal cross-sectional shape of the crucible 5A for growing a single crystal should not be deformed by a fluid pressure of the raw material melt 8.

Figure 10:
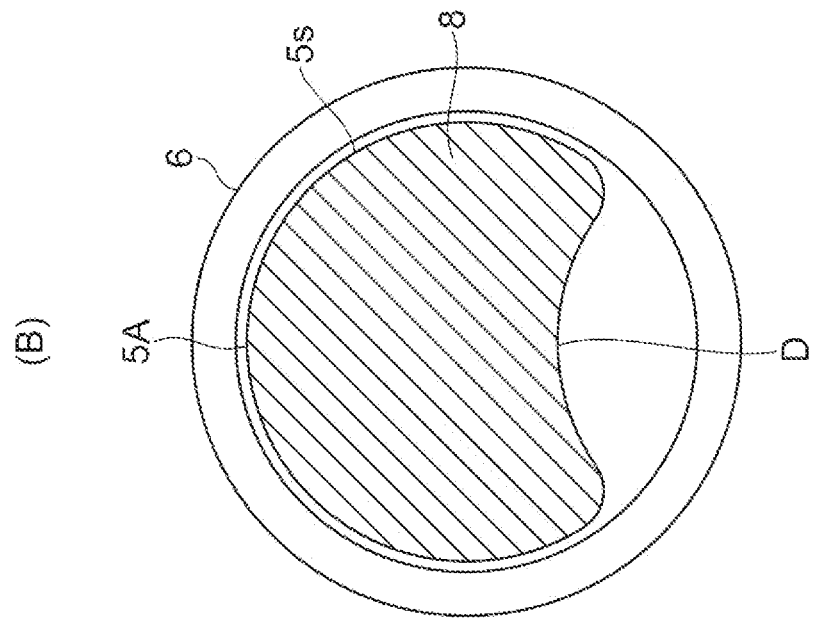
FIG. 10(A) is a diagram illustrating a cross-section of the crucible for growing a single crystal during the single crystal growth in the experimental example.
FIG. 10(B) is a diagram illustrating a cross-section of the crucible for growing a single crystal during cooling in the experimental example.
Figure 10:
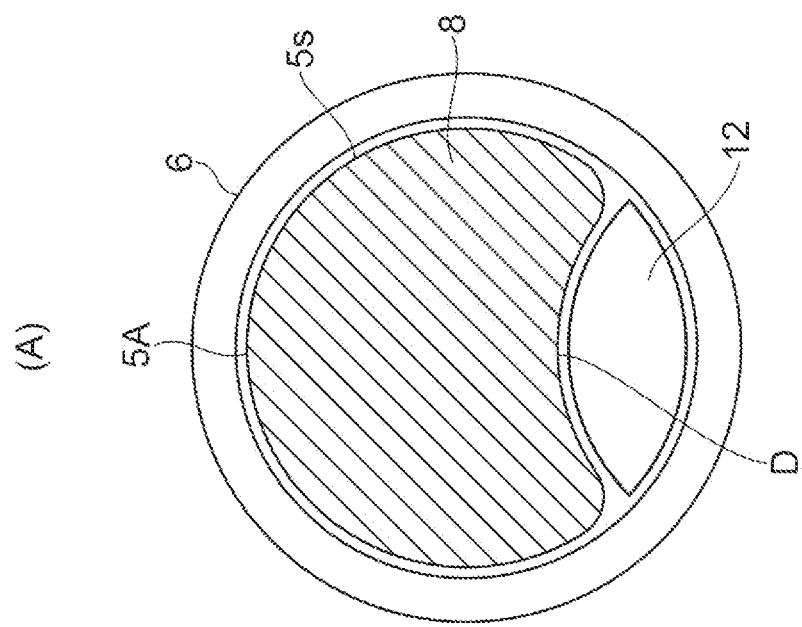

After the crystal growth was completed, that is, after the raw material melt 8 inside the crucible 05 was completely solidified, and before proceeding to a cooling process, the crucible outer circumference holding jig 12 was removed from the recess D as illustrated in FIG. 10(B). As a result, a space is generated in front of the recess D formed in the crucible 5A for growing a single crystal, and the crucible 5A for growing a single crystal may extend outward at a position of the recess D.

Figure 11:
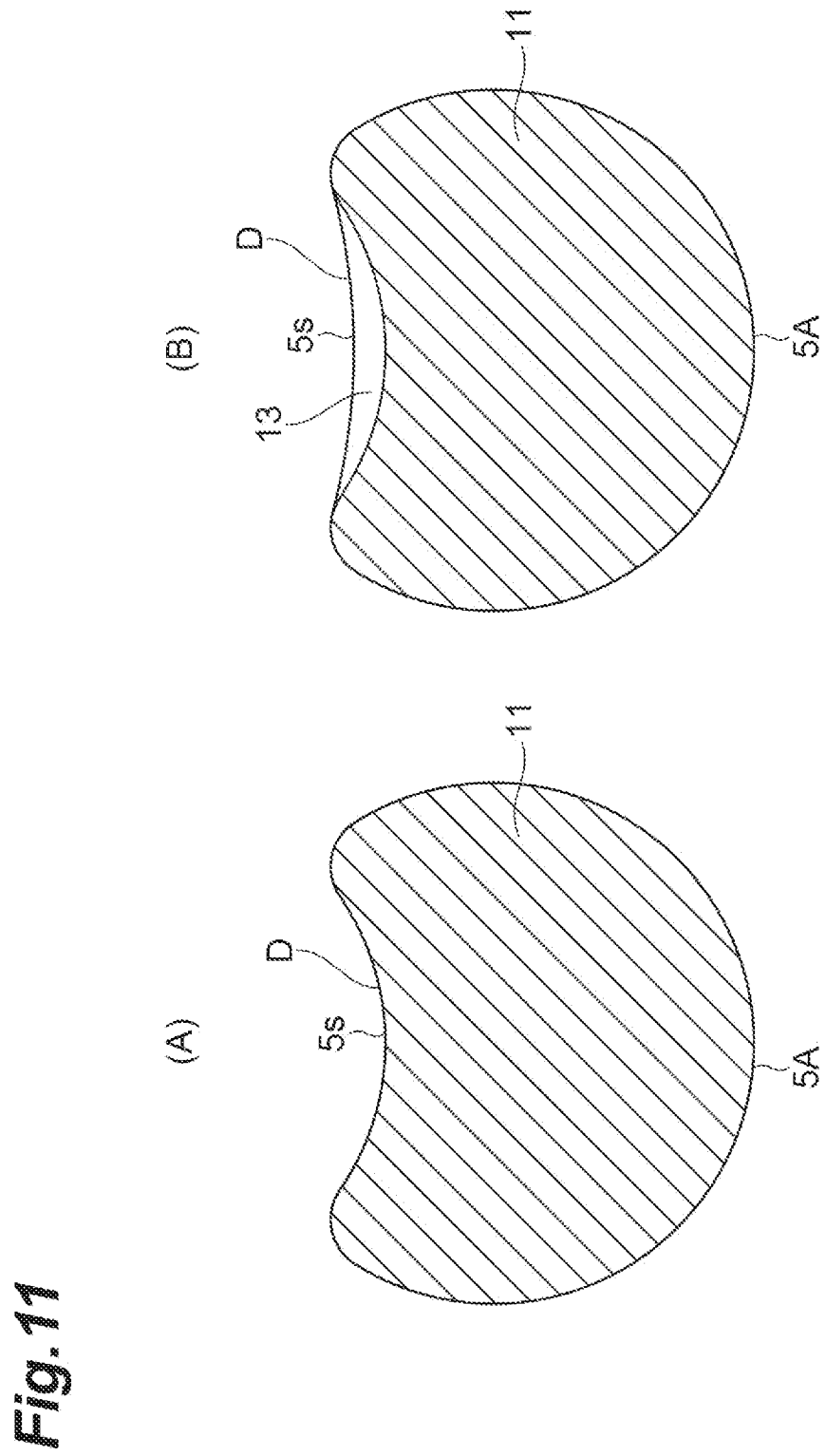
FIG. 11(A) is a diagram illustrating a cross-section of the crucible for growing a single crystal before the cooling of the crystal in the experimental example.
FIG. 11(B) is a diagram illustrating a cross-section of the crucible for growing a single crystal after the cooling of the crystal in the experimental example.

FIG. 11A illustrates the state before entering the cooling step, and FIG. 11(B) illustrates the state after finishing the cooling process, after the crystal growth. When the crucible 5A for growing a single crystal is recovered from the apparatus 1 for growing a single crystal cooled to room temperature through the process of growing a single crystal, as illustrated in FIG. 11(B), in the recess D of the crucible 5A for growing a single crystal, a gap 13 was formed between the side wall part 5s and the single crystal 11.

Since the heat shrinkage of the crucible 5A for growing a single crystal that occurs in the cooling process does not tighten the single crystal 11 as stress, when a spatula-shaped jig was inserted into the gap 13 and moved along the side surface of the single crystal 11, it was possible to move the jig without great resistance, and as the jig was moved, the crucible 5A for growing a single crystal and the single crystal 11 were easily peeled off without sticking. After the jig was inserted deeper from an opening of the crucible 5A for growing a single crystal toward the back and the same peeling operation was performed on the entire side surface of the single crystal 11, when the entire crucible 5A for growing a single crystal was carefully shaken with the opening of the crucible 5A for growing a single crystal facing down, the single crystal 11 fell from the crucible 5A for growing a single crystal due to its own weight, and the single crystal 11 could be recovered.

By the peeling operation by the jig insertion, some deformations occurred in a few place in the shape of the crucible 5A for growing a single crystal, which is a trivial problem, and the shape of the single crystal 11 was restored to the shape before growth by restoration by molding. It was confirmed that there were no cracks and no leakage as a container, and after the inside of the crucible 5A for growing a single crystal was acid-cleaned, the crucible 5A for growing a single crystal was reused for the growth of the next single crystal 11. Similarly, when the single crystal growth were carried out 10 times in total, the single crystal 11 having no cracks on the side surface was obtained 10 times in total.

Comparative Example

Figure 13:
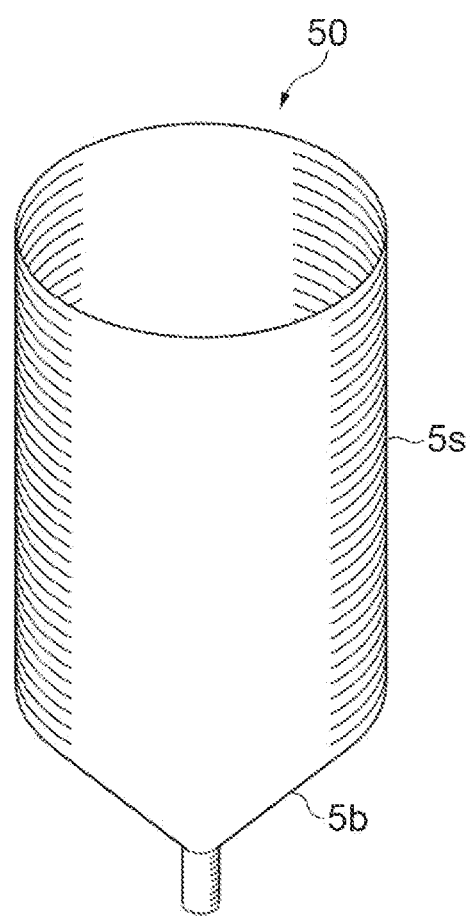
FIG. 13 is a schematic perspective view illustrating the shape of the crucible for growing a single crystal generally used.
Figure 14:
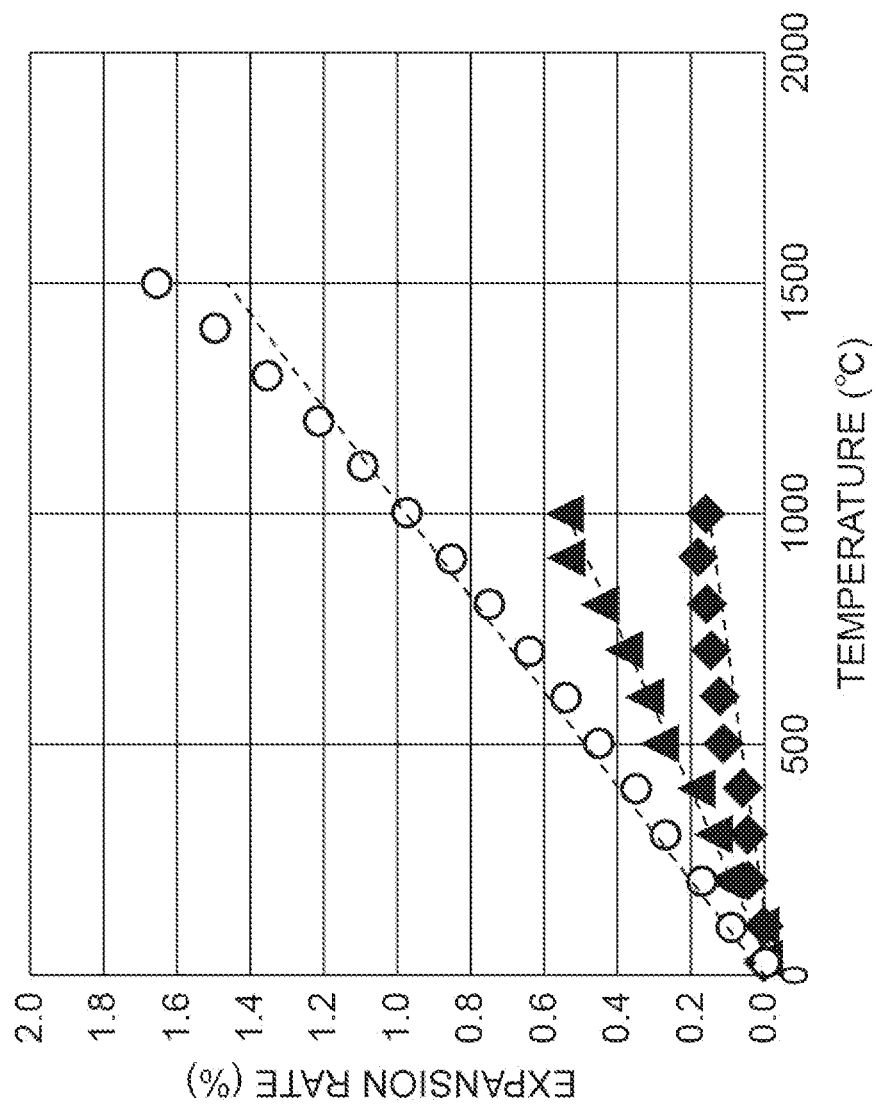
FIG. 14 is a diagram illustrating coefficients of thermal expansion of a Pt—Rh alloy and $\beta$-$Ga_2O_3$ at high temperature.

Using the apparatus 1 for growing a single crystal as the experimental example, a β-Ga$_2$O$_3$ single crystal was grown by a VB method. As illustrated in FIG. 13, a cross-sectional shape of a side wall part 5s of a crucible 50 for growing a single crystal is approximately a perfect circle, and the single crystal 11 was grown under the same conditions as in the experimental example in other respects except that the crucible 50 for growing a single crystal in which a recess D is not provided in the side wall part 5s was used. Since the recess D is not formed in the side wall part 5s, in the state in which the raw material melt 8 exists inside the crucible 50 for growing a single crystal, an operation of bringing a crucible outer circumference holding jig 12 into contact with the side wall part 5s of the crucible 50 for growing a single crystal and an operation of removing the crucible outer circumference holding jig 12 from the side wall part 5s of the crucible 50 for growing a single crystal before proceeding to the cooling condition were omitted.

When the crucible 50 for growing a single crystal is recovered from the apparatus 1 for growing a single crystal cooled to room temperature through the process of growing a single crystal, the side wall part 5s of the crucible 50 for growing a single crystal and the single crystal 11 were in close contact with each other without a gap 13. Since the heat shrinkage of the crucible 50 for growing a single crystal that occurs in the cooling process tightens the single crystal 11 as stress, when a spatula-shaped jig is forcibly inserted between the single crystal 11 and the side wall part 5s of the crucible 50 for growing a single crystal, cracks occurred from an opening of the crucible 50 for growing a single crystal. Even if the opening of the crucible 50 for growing a single crystal is deformed and a tip portion of the spatula-shaped jig enters between the single crystal 11 and the side wall part 5s of the crucible 50 for growing a single crystal, jig was difficult to move along the side surface of the single crystal 11 without cracks being spread.

As a result, it was not possible to extract the single crystal 11 without destroying the crucible 50 for growing a single crystal, and it was impossible to reuse the crucible 50 for growing a single crystal. In addition, a plurality of cracks were observed on the side surface of the extracted single crystal 11.

Comparison of Crystallinity

The crystallinity of the single crystals grown in the above experimental example and comparative example was evaluated as follows.

Evaluation of Crystallinity

The crystallinity of the grown single crystal 11 was evaluated by measuring the crystal orientation and the defect density. Prior to the evaluation, a thin piece having about 1 cm square and about 0.4 mm thick was cut out from the single crystal 11 on which the substrate for evaluation was grown so that a main surface became a (100) plane, and a single crystal substrate was produced in which the main surfaces of the front and back surfaces were mirror-polished. Both main surfaces were further finished in a state in which the processing damage layer was removed by chemical mechanical polishing (CMP) using colloidal silica. Four substrates for evaluation were prepared from the central part of the single crystal 11, and seven substrates for evaluation in the experimental example and eight substrates for evaluation in the comparative example were prepared from a position about 1 cm inside from the outer circumference of the single crystal, and each average value and variation were used as evaluation values.

Crystal Orientation

For the crystallinity of the grown single crystal 11, a half width (FWMH) of an X-ray rocking curve (XRC) was measured using SmartLab (trade name) manufactured by RIGAKU. For the measurement, the crystal orientation was evaluated by using a two-crystal Ge (220) as a monochromator and ω-scanning a diffraction of a (400) plane by monochromatic X-ray (CuKα1: λ=1.5405A).

Defect Density

Defect density was measured by chemical etching with hot phosphoric acid (85 wt % H3PO4: 140° C.). Since a portion having a defect near the surface of the substrate has a higher etching rate than a portion having no defect, and therefore, appears as a dent (etch pit) on the surface of the substrate by etching. The density per unit area of linear pits extending in a [010] direction and having a length of several μm to several hundred μm was measured and evaluated as the defect density.

Evaluation Result of Crystallinity

Figure 12:
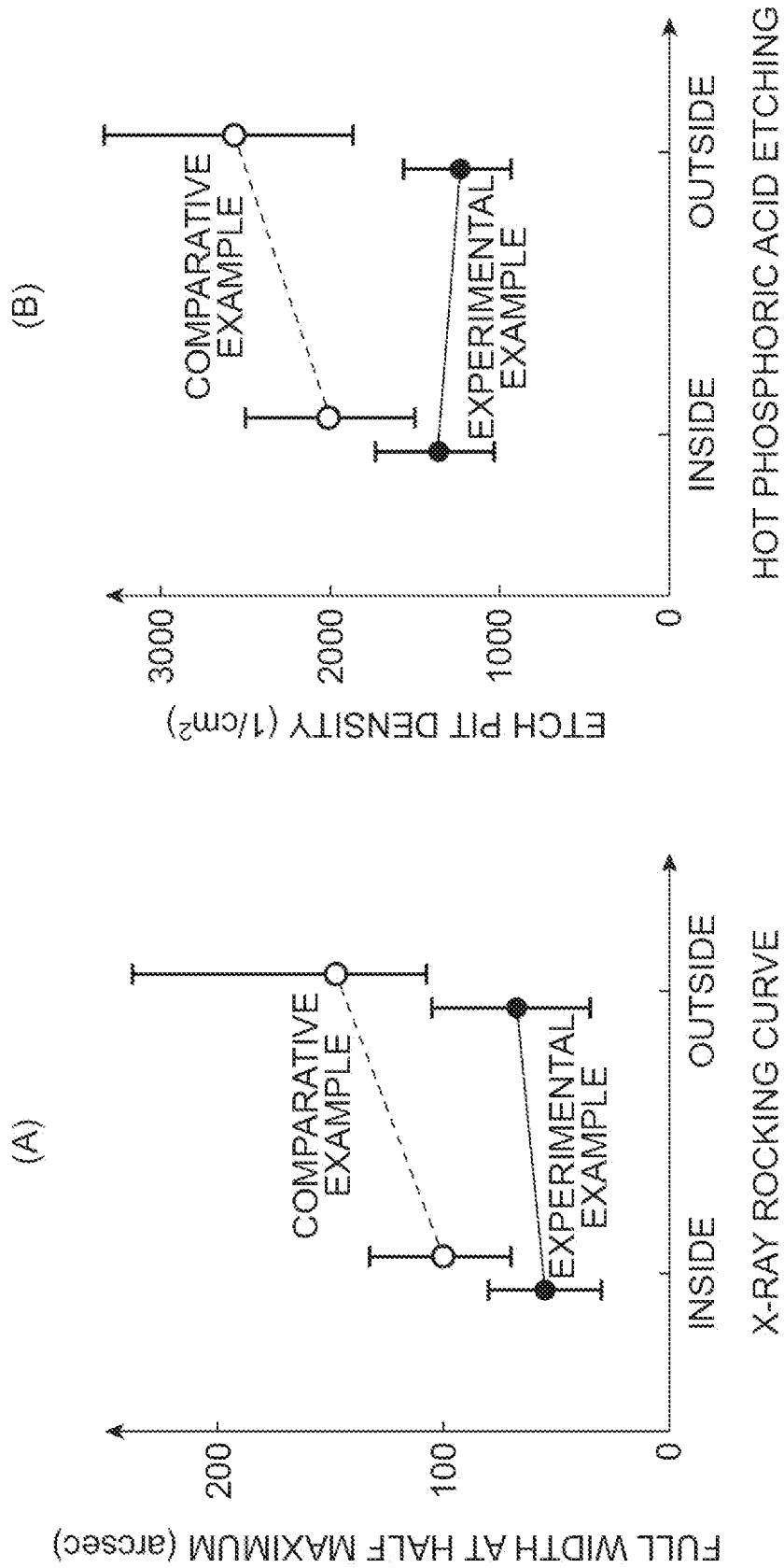
FIG. 12(A) is a graph illustrating a crystal orientation of the single crystal in the experimental example and the comparative example.
FIG. 12(B) is a graph illustrating a defect density of the single crystal in the experimental example and the comparative example.

FIGS. 12(A) and 12(B) illustrate the evaluation results of the crystallinity of the single crystal grown by the above experimental example and comparative example. FIG. 12(A) illustrates the measurement result of the X-ray rocking curve, and FIG. 12(B) illustrates the results of hot phosphoric acid etching. The results of the experimental example are plotted with a black circle (●), the results of the comparative example are plotted with a white circle (○), and the substrate for evaluation is further classified into the inside and the outside from a location cut out from the single crystal.

In the measurement results of the X-ray rocking curve illustrated in FIG. 12(A), there was no significant difference between the inside and outside of the crystal in the measurement results of the experimental example, and a full width at half maximum (FWHM) was less than 100 arcsec in both cases. On the other hand, the single crystal 11 grown in the comparative example has a larger full width at half maximum as a whole than the single crystal 11 grown in the experimental example, and the tendency is remarkably shown on the outside. This is a result that the phenomenon that a peak splits on the rocking curve on the outside is observed, and the average value and variation of the full width at half maximum are increased.

The hot phosphoric acid etching results illustrated in FIG. 12(B) were the result that in the single crystal 11 grown in the experimental example, there was little change between the inside and outside of the single crystal 11, and the average value of the etch pit density is below 1500/cm². On the other hand, the etch pit density of the single crystal 11 grown in the comparative example is higher as a whole than that of the single crystal 11 grown in the experimental example, and is particularly high on the outside. Compared with the experimental example, in the comparative example, a large number of strip-shaped pit high-density regions were distributed on the outside.

As described above, in both the X-ray rocking curve measurement and the etch pit density measurement result by hot phosphoric acid etching, the effect of improving the crystallinity on the outside of the crystal was confirmed by the single crystal growth method according to this experimental example.

INDUSTRIAL APPLICABILITY

According to the crucible for growing a single crystal, the method of manufacturing a single crystal, and the single crystal according to the embodiment of the present invention, it is possible to reduce the application of the stress caused by the shrinkage of the cooled crucible to the grown single crystal.

REFERENCE SIGNS LIST

1 Apparatus for growing a single crystal
2 Chamber
3 Heat insulating material
4 Heater
5A, 5B Crucible for growing a single crystal
5s Side wall part
5b Bottom part
6 Crucible holder
7 Crucible receiving shaft
8 Raw material melt
9 Raw material
10 Seed crystal
11 Single crystal
12 Crucible outer circumference holding jig
13 Gap
50 Crucible for growing a single crystal
S Horizontal plane
C Crucible cross-section region
Lmin Closed curve
R Closed curve P Inflection point
D Recess

The invention claimed is:

1. A method of manufacturing a single crystal using a crucible for growing the single crystal,
wherein the crucible accommodates a raw material melt for growing the single crystal being solidified therein and comprises:
a side wall part configured to surround the raw material melt; and
a bottom part configured to support the raw material melt while being continuous with the side wall part,
wherein, in a horizontal cross-sectional view, the side wall part is of a smooth, closed, curved shape, has a thickness of 1 mm or less, includes an outer surface having a recess and able to contact a crucible outer circumference holding jig, and is able to extend outward at a position of the recess when removing the crucible outer circumference holding jig from the recess, and
wherein the method comprises:
melting the raw material in the crucible;
abutting the crucible outer circumference holding jig with the recess when the raw material is in a melting state;
removing the outer circumference holding jig from the recess after complete solidification of the raw material melt inside the crucible; and
cooling the crucible after removing the outer circumference holding jig from the recess.

2. The method according to claim 1, wherein the side wall part has a tapered shape that extends upward from the bottom part.

3. The method according to claim 1, wherein the side wall part and the bottom part are made of either Pt or a Pt—Rh alloy, and the raw material melt is used for growing a $\beta$-$Ga_2O_3$-based single crystal.

4. The method according to claim 1,
wherein, in a horizontal cross-section view,
r is a distance between a center of the crucible and the side wall part,
the distance r is a function of an angle $\theta$,
the angle $\theta$ is a direction of the distance r, and
a derivative $dr/d\theta$ of the function is continuous when the intersection between the direction of the distance r and the side wall part moves across the recess.

* * * * *